United States Patent [19]
Leidich

[11] 3,855,540
[45] Dec. 17, 1974

[54] PUSH-PULL TRANSISTOR AMPLIFIER WITH DRIVER CIRCUITS PROVIDING OVER-CURRENT PROTECTION

[75] Inventor: Arthur John Leidich, Flemington, N.J.

[73] Assignee: RCA Corporation, New York, N.Y.

[22] Filed: Dec. 13, 1973

[21] Appl. No.: 424,418

[52] U.S. Cl. ........................ 330/14, 330/15, 330/28, 330/38 M
[51] Int. Cl. ........................ H03f 3/26
[58] Field of Search .......... 330/14, 15, 18, 28, 38 M

[56] References Cited

UNITED STATES PATENTS

| | | | |
|---|---|---|---|
| 3,142,807 | 7/1964 | Sharma | 330/15 |
| 3,526,845 | 9/1970 | Sikorra | 330/15 X |
| 3,611,170 | 10/1971 | Wheatley, Jr. | 330/15 X |

*Primary Examiner*—Siegfried H. Grimm
*Attorney, Agent, or Firm*—H. Christoffersen; S. Cohen

[57] ABSTRACT

An amplifier having output transistors with collector-to-emitter paths connected in series for application of operating potential and connected in push-pull for signal, is afforded over-current protection by limiting the sum of the base currents available to the output transistors. This sum current is applied to a node to which the base electrode of one of the output transistors is connected, and the distribution of this current between the base electrodes of two output transistors is controlled by a signal-responsive variable-conduction device connected between the base electrodes of the two output transistors. Class AB operation of the output transistor may be obtained by connecting separate non-linear resistance networks in parallel with each of their base emitter junctions.

24 Claims, 4 Drawing Figures

TRANSISTOR AMPLIFIER WITH DRIVER CIRCUITS PROVIDING OVER-CURRENT PROTECTION

The present invention relates to push-pull amplifiers with over-current protection.

In the prior art, over-current protection has been provided for push-pull amplifying stages using transistors with collector-to-emitter paths serially connected for application of operating potential. The current flowing in the collector-to-emitter path of an amplifying stage transistor is passed through a resistor to develop a potential thereacross related to the current being supplied to a load. This potential is applied to the base-emitter junction of an auxiliary transistor. Under conditions which would otherwise cause an over-current condition, this potential is sufficiently large to cause conduction of the collector-to-emitter path of the auxiliary transistor. The collector-to-emitter path of the auxiliary transistor is connected across the base-emitter junction of the amplifying transistor. Conduction of the auxiliary transistor diverts drive current from being applied to the amplifying transistor and thus forestalls the over-current condition. This prior-art method of over-current protection entails the use of feedback and the feedback loop is prone to undesirable oscillatory tendencies.

One aspect of the present invention is embodied in an amplifier with push-pull amplifying stages which use transistors having collector-to-emitter paths serially connected for application of operating potential and having over-current protection afforded by maintaining the sum of currents applied to their base elecrodes at substantially constant predetermined value.

Another aspect of the present invention is embodied in a Class AB amplifier with push-pull amplifying stages which use transistors having collector-to-emitter paths serially connected for application of operating potential, having each of their base-emitter junctions parallelled with a respective non-linear resistive network, and having the sum of the currents applied to their respective base electrodes maintained at a substantially constant predetermined value.

Certain preferred embodiments of the present invention combine the inventive aspects set forth in the preceding two paragraphs.

IN THE DRAWING

Figure 1:
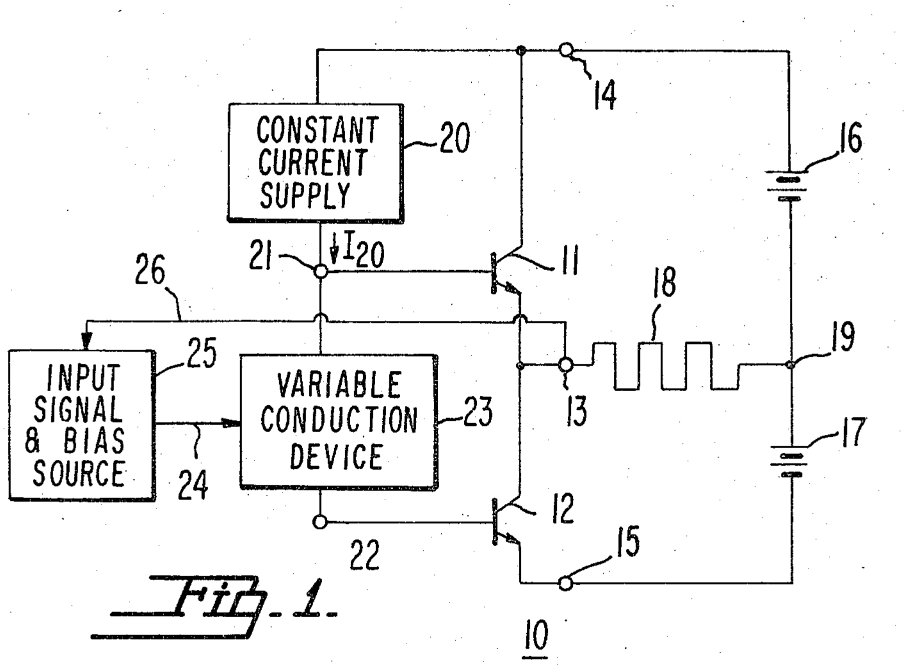
FIG. 1 is a diagram, partially in schematic and partially in block form, of a basic amplifier configuration in which the present invention is embodied.

FIG. 1 shows a basic amplifier configuration 10, with an output amplifying stage comprising transistors 11 and 12. The emitter electrode of transistor 11 and the collector electrode of transistor 12 are connected to a terminal 13 from which output signal is to be provided. Terminals 14 and 15, to which the collector electrode of transistor 11 and the emitter electrode of transistor 12 are respectively connected, are suitable for application of an operating potential therebetween. Such operating potential is supplied from the serially-connected operating power supplies 16 and 17. A load 18 for the amplifier may be direct coupled between output terminals 13 and an interconnection 19 between supplies 16 and 17, as shown. Alternatively, the load 18 may be connected in series with a capacitor between output terminal 13 and either of the terminals 14 and 15, permitting a single operating supply in place of the serially-connected operating supplies 16 and 17.

Transistors 11 and 12 have substantially equal common-emitter forward current gains (that is, substantially equal $h_{fe}$'s). A constant current source 20 provides a substantially fixed current, $I_{20}$, which is equal to the maximum output current to be delivered via output terminal 13, divided by the forward current gain of the output transistor 11 or 12. A portion of current $I_{20}$ may flow through variable conduction device 23 to the base electrode of transistor 12, and the remainder of current $I_{20}$ will be supplied to the base electrode off transistor 11. The portion of the current $I_{20}$ diverted from flowing to the base electrode of transistor 11 is instead directed to the base electrode of transistor 12 in proportion to the conductance of device 23 between terminals 21 and 22. The conductance of device 23 between terminals 21 and 22 varies in response to an input and a bias signal, applied thereto via a connection 24 from a source 25 of input and bias signals.

The bias signal applied to the variable conduction device 23 in the absence of input signal preferably is chosen to be at a level which causes sufficient conduction of the device 23 to divide $I_{20}$ into first and second fractional currents which are approximately equal. These first and second fractional currents are applied to the base electrodes of transistors 11 and 12, respectively, to cause the emitter current of transistor 11 to equal the collector current of transistor 12. These quiescent conditions may be automatically secured by using a voltage feedback connection 26 coupling signal from output terminal 13 to input and bias signals source 25.

Input signal of a first polarity (assumed, for example, to be positive) increases the conductance of the variable conduction device 23 between terminals 21 and 22. Since the potential appearing at terminal 22 is constrained by conduction of the base-emitter junction of transistor 12, to be no more than a few tenths of a volt above the potential at terminal 15, the increased conductance of device 23 requires that the potential at terminal 21 to which the base electrode of transistor 11 is connected, become less positive or more negative with respect to the potential appearing at terminal 19. This change is in a direction to reduce the conductance of the collector-to-emitter path of transistor 11. Since there is consequently less current flow through the base-emitter junction of transistor 11, the input impedance it offers at its base electrode to current source 20 increases. Accordingly, the first fractional part of $I_{20}$ flowing to the base electrode of transistor 11 is reduced, and the second fractional part of current $I_{20}$ flowing to the base electrode of transistor 12 is increased. Transistor 12 becomes increasingly conductive, which lowers the input impedance it offers at its base electrode. The decreased conduction of transistor 11 and increased conduction of transistor 12 causes the output signal level appearing at output terminal 13 to swing toward the negative potential appearing at terminal 15.

Input signal of a second plurality (assumed, for consistency with the previous example, to be negative) decreases the conductance of the variable conduction device 23, between terminals 21 and 22. The variable conduction device 23 offers increased resistance to current flow therethrough, and the potential appearing between terminals 21 and 22 increases. Accordingly, the base current flowing to transistor 12 tends to be reduced, and the increased potential appearing at the base electrode of transistor 11 tends to bias it into increased conduction. The increased conduction of transistor 11 decreases its input impedance as offered at its base electrode. Consequently, the first fractional part of $I_{20}$ increases, while the second fractional part of $I_{20}$ decreases. That is, the base current of transistor 11 is increased, and the base current of transistor 12 is decreased. The decreased conduction of transistor 12 and the increased conduction of transistor 11 causes the output signal level appearing at output terminal 13 to swing toward the positive potential appearing at terminal 14.

In the quiescent condition, in which the conductance of the collector-to-emitter paths of transistors 11 and 12 are equal, equal halves of the quiescent current $I_{20}$ supplied from the source 20 are supplied to the respective base electrodes of the transistors 11 and 12. Their collector-to-emitter currents cannot exceed this base current level multiplied by their $h_{fe}$. For any condition in which the conduction of one of the transistors 11 and 12 is greater than that of the other, the base current of the more conductive of the transistors cannot exceed $I_{20}$. Therefore, under no condition, can the collector-to-emitter current of the more conductive transistor exceed $I_{20}$ times its $h_{fe}$.

An aspect of the present invention is the selection of the quiescent current level $I_{20}$, to be provided by source 20 to provide for over-current protection of transistors 11 and 12. Such over-current protection is designed in the following manner. The maximum current level in either of the output transistors 11 or 12, which must not be exceeded without risk of its thermal destruction or change in its operating characteristics, is determined. The maximum $h_{fe}$ of the output transistor 11 or 12 is determined. The maximum output current divided by the maximum $h_{fe}$ of the output transistor defines the proper quiescent current level $I_{20}$ to be provided by the constant current source 20 to provide over-current protection for the output transistors 11 and 12.

Figure 2:
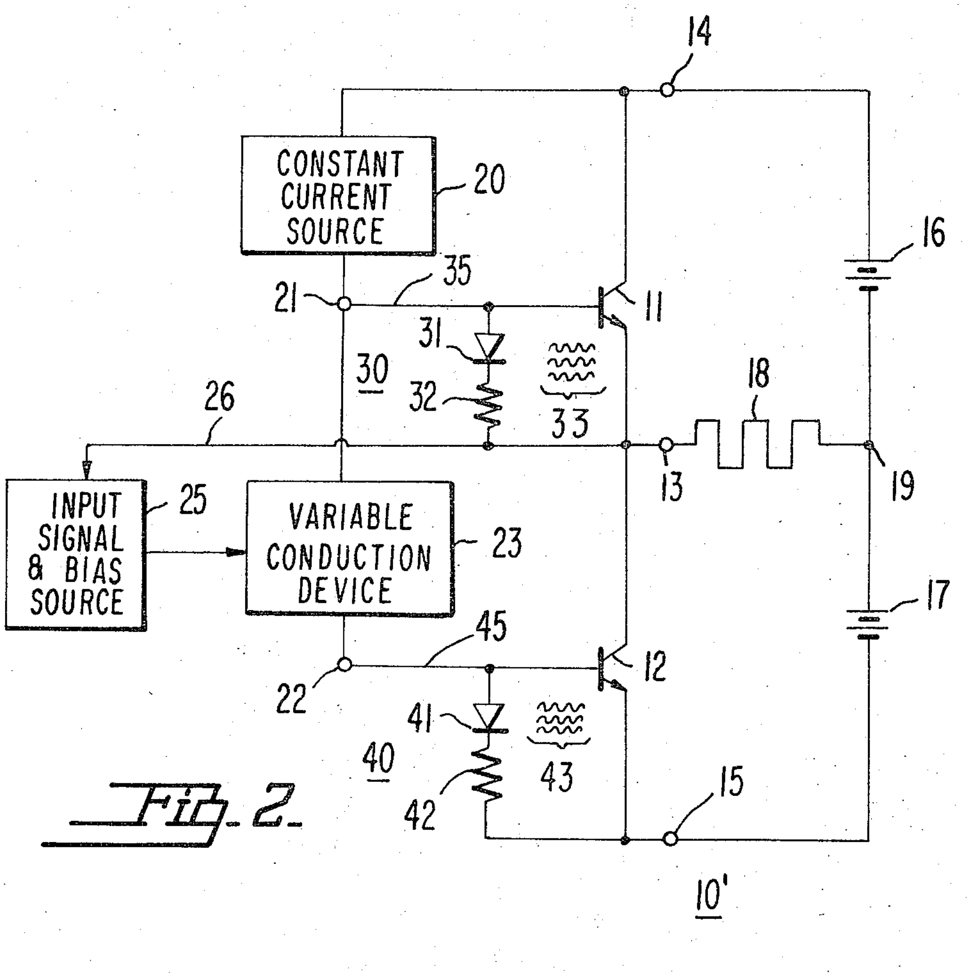
FIG. 2 is a diagram partially in schematic and partially in block form of a novel modification of the basic amplifier configuration of FIG. 1, which modification is suited for Class AB operation.

FIG. 2 shows a modification 10' of the basic amplifier configuration 10 which permits Class AB operation. The modified amplifier 10' is a quasi-linear amplifier in which terminal 13 supplies an output signal linearly proportional over a given range to input signals from source 25. Output transistors 11 and 12, however, operate linearly over only a little more than half of this range and otherwise operate substantially non-conductively (i.e., "cut-off").

The base-emitter junction of transistor 11 is parallelled with a non-linear resistive network 30 shown as comprising a diode 31 and a linear resistive element 32. Diode 31 and the base-emitter junction of transistor 11 are maintained at substantially equal temperatures by means of a bilateral thermal coupling 33 between them. Similarly, the base-emitter junction of transistor 12 is parallelled with a non-linear resistive network 40 shown as comprising a diode 41 and a linear resistive element 42. A bilateral thermal coupling 43 between diode 41 and the base-emitter junction of transistor 12 maintains them at substantially the same temperature. Diodes 31 and 41 may each consist of a transistor having its base electrode connected to its collector electrode, with the anodic and cathodic electrodes of the diode being provided by separate ones of the collector and emitter electrodes of the transistor.

The parallelling of the base-emitter junction of a transistor with this type of non-linear resistive network is known per se from U.S. Pat. No. 3,534,279, entitled "High Current Transistor Amplifier Stage Operable With Low Current Biasing", issued Oct. 13, 1970 to Allen LeRoy Limberg and assigned to RCA Corporation. In the Limberg patent, however, substantially fixed biasing currents are applied to the non-linear resistive network, and signal currents applied to the amplifier transistor are decoupled therefrom. This is in contradistinction to the FIG. 2 configuration in which currents varying proportionally with an input signal are applied the base-emitter junction of each of the amplifier transistors 11, 12 and to the non-linear resistive networks 30, 40 connected in parallel therewith.

The currents $I_{35}$ and $I_{45}$ flowing along the paths 35 and 45, respectively, correspond to the first and the second fractional parts of $I_{20}$, respectively, previously referred to. That is:

$$I_{20} = I_{35} + I_{45} \quad (1)$$

Assuming the $h_{fe}$'s of transistors 11 and 12 to be in the normal range (greater than 50) the currents $I_{35}$ and $I_{45}$ flowing along paths 29 and 34 will thereafter continue to flow primarily through non-linear resistive networks 30 and 40, respectively.

The biasing of transistor 11 will now be considered specifically, the biasing of transistor 12 being analagous thereto. The potential drop $V_D$ across the diode 31, which is a junction diode, is given by the following expression:

$$V_D = kT/q \ \ln I_{35}/I_{S31} \quad (2)$$

where:

$k$ is Boltzmann's constant, $T$ is absolute temperature, $q$ is the charge on an electron, and $I_{S31}$ is the saturation current level of the junction diode 31.

The potential drop $V_R$ across the resistor 32 obeys Ohm's Law, $$V_R = I_{35} R_{32}, \quad (3)$$

where $R_{32}$ is the resistance of resistor 32. The collector current $I_{C11}$ of transistor 11 has the following relationship to its base-emitter voltage $V_{BE11}$.

$$V_{BE11} = kT/q \ \ln I_{C11}/I_{S11} \quad (4)$$

where $I_{S11}$ is the saturation current level of junction transistor 11. Now, $$V_{BE11} = V_D + V_R \tag{5}$$

Substituting equations 2, 3 and 4 into equation 5 yields:

$$kT/q \ \ln I_{C11}/I_{S11} = kT/q \ \ln I_{35}/I_{S31} + I_{35} R_{32} \tag{6}$$

The saturation currents $I_{S11}$ and $I_{S31}$ are related in $n$:1 ratio. If the diode 31 and the base-emitter junction of transistor 11 have similar diffusion profiles, their effective junction areas will be in the same ratio as their saturation currents. Equation 6 can be rewritten as follows:

$$kT/q \ \ln I_{C11}/nI_{S31} = kT/q \ \ln I_{35}/I_{S31} + I_{35} R_{32} \tag{7}$$

Rearranging:

$$kT/q \ \ln I_{C11}/nI_{35} = I_{35} R_{32}, \text{ and} \tag{8}$$

$$I_{C11} = nI_{35} \exp q\, I_{35} R_{32}/kT \tag{9}$$

Under quiescent conditions—that is, at idle—source 25 supplies no input signal but only a bias signal sufficient to make the emitter current of transistor 11 equal to the collector current of transistor 12. $I_{35}$ and $I_{45}$ are in ratio $h_{fe}$:$(h_{fe} + 1)$, assuming the common-emitter current gains of transistors 11 and 12 each to equal $h_{fe}$. That is, $I_{35}$ and $I_{45}$ are substantially equal to each other and therefore to $I_{20}/2$. For the maximum current condition in transistor 11, $I_{35}$ equals $I_{20}$. These conditions can be substituted into equation 9 to obtain expressions for $I_{C11\text{-}IDLE}$ and $I_{C11\text{-}MAX}$, the values of $I_{C11}$ during idle and maximum conduction conditions, respectively, of transistor 11.

$$I_{C11\text{-}IDLE} = nI_{20}/2 \exp q\, I_{20} R_{32}/2kT \tag{10}$$

$$I_{C11\text{-}MAX} = nI_{20} \exp q\, I_{20} R_{32}/kT \tag{11}$$

$I_{C11\text{-}MAX}$ is seen to be larger than twice $I_{C11\text{-}IDLE}$ by virtue of the larger exponential term in equation 11 as compared to equation 10. The ratio of $I_{C11\text{-}MAX}$ to $I_{C11\text{-}IDLE}$ is obtained by dividing equation 11 by equation 10.

$$\frac{I_{C11-MAX}}{I_{C11-IDLE}} = 2\left[\frac{\exp\frac{qI_{20}R_{32}}{kT}}{\exp\frac{q_{20}IR_{32}}{2kT}}\right] = 2\left[\frac{\exp\frac{qI_{20}R_{32}}{2kT} + \exp 2}{\exp\frac{qI_{20}R_{32}}{2kT}}\right] = 2\left[1 + \frac{\exp 2}{\exp\frac{qI_{20}R_{32}}{2kT}}\right] \tag{12}$$

Values of $I_{20}R_{32}$ smaller than 52 millivolts—that is, smaller than $2kT/q$—will give $I_{C11\text{-}MAX}/I_{C11\text{-}IDLE}$ ratio ranging upward from 4.

Very high $I_{C11\text{-}MAX}/I_{C11\text{-}IDLE}$ ratios are not obtainable using single transistors for output transistors 11 and 12 and single diodes 31 and 41 in the non-linear resistive networks 30 and 40, since then the base currents of transistors 11 and 12 dominate over the current flows through the non-linear resistive networks 30, 40, thereby tending to return operation toward Class A. But, moderate reductions in the amount of quiescent current demanded of source 20 to maintain desired output current levels can be obtained, which work to good advantage in operational amplifiers and other amplifiers where output powers do not exceed hundreds of milliwatts or a few watts, and consequently relatively high quiescent output current to peak output currents can be tolerated. An acceptable ratio of $I_{C11\text{-}IDLE}$ to $I_{C11\text{-}MAX}$ is about an order of magnitude smaller than the common-emitter forward current gain of transistors 11 and 12.

Knowing the permissible value of $I_{C11\text{-}MAX}$ and a acceptable ratio of $I_{C11\text{-}IDLE}$ to $I_{C11\text{-}MAX}$, equations 10 and 11 can be solved against each other to determine appropraite relationships between $n$, $R_{32}$ and $I_{20}$.

Another way to view the operation of the transistor 11 together with non-linear resistive network 30 is as follows. As $I_{35}$ is increased, the increased potential drop across resistor 32 acts to increase the ratio of $I_{C11}$ to $I_{35}$ at a faster than linear rate. At relative low levels of $I_{35}$, there is substantially no potential drop across resistor 32. Therefore, $I_{C11}$ is proportional to $I_{35}$, being related to $I_{35}$ by a factor $n$ because of the well-known current mirror amplifier action provided by any transistor with a diode parallelling its base-emitter junction. At relatively high levels of $I_{35}$, the potential drop across resistor 32 becomes of substantial consequence causing the ratio of $I_{C11}$ to $I_{35}$ to be substantially greater than $n$, as taught by Limberg in U.S. Pat. No. 3,534,279.

In configurations of the type shown in FIG. 2, diodes 31 and 41 may each comprise a transistor with collector-to-base feedback. And, in such a modification, the transistors can each be replaced by a Darlington cascade of transistors to obtain a higher ratio of peak output current to quiescent output current.

Figure 3:
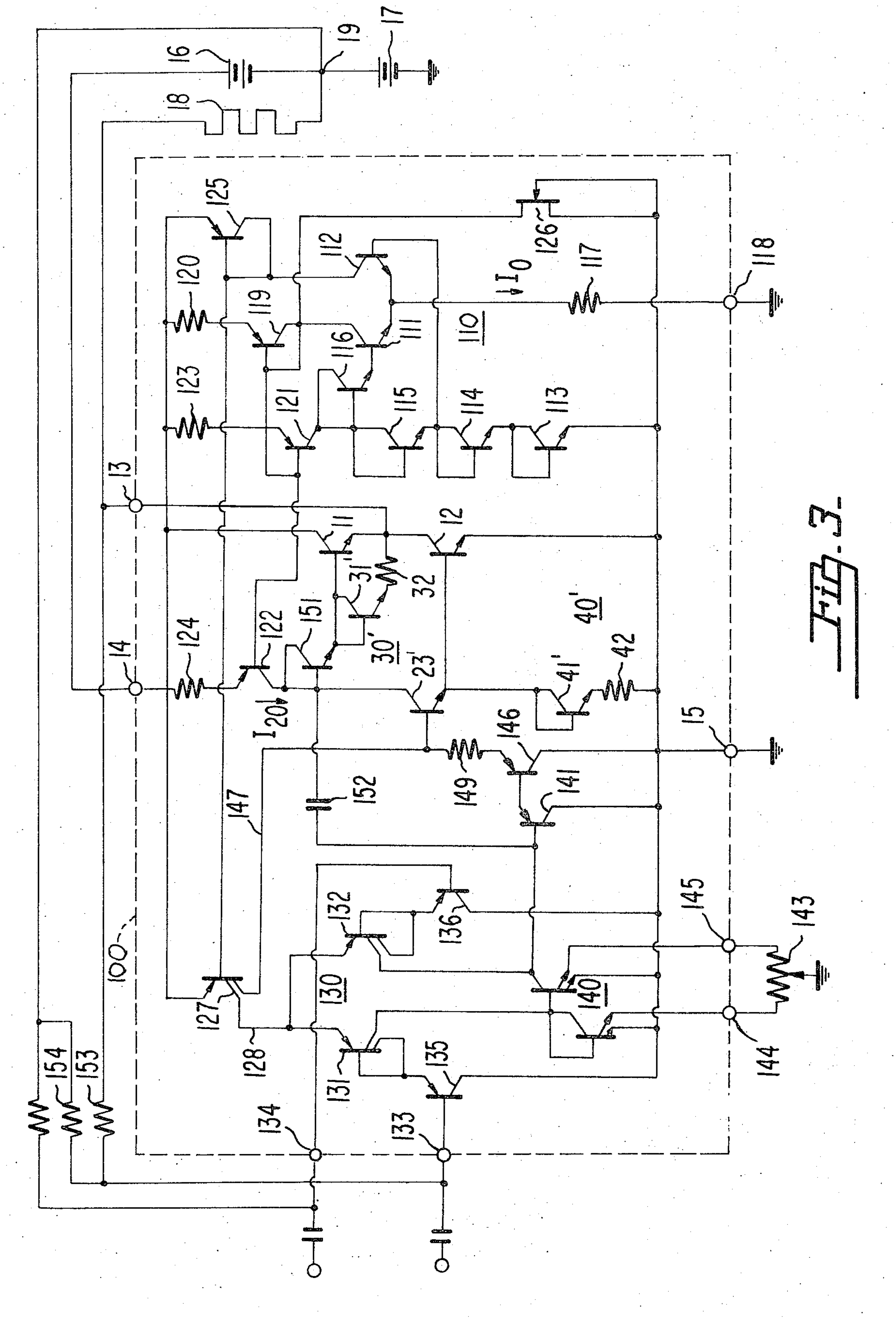
FIG. 3 is a schematic diagram of an amplifier, which includes a preamplifier as well as a driver and output amplifier stages, which is suitable for construction primarily in monolithic integrated amplifier circuit form, and which embodies the present invention.

FIG. 3 shows a Class AB amplifier 100, which is shown constructed substantially within the confines of a monolithic semiconductor integrated circuit represented by dashed outline. In amplifier 100, the variable conduction device 23 comprises a transistor 23' of a conductivity type the same as that of the output transistors 11 and 12.

Included within circuit 100 is a biasing network 110 of the type described in detail in my U.S. Pat. application Ser. No. 403,990, filed Oct. 5, 1973, entitled "CURRENT PROPORTIONING CIRCUIT", and assigned, like the present application, to RCA Corporation. A current $I_0$ is withdrawn from the joined emitter electrodes of transistors 111 and 112. The potential appearing at the joined emitter electrodes of transistors 11 and 12 is equal to the offset potential across a forward- biased semiconductor junction (that is, $V_{BE}$ = 0.65 millivolts, approximately, for a silicon junction with 100 crystal axis orientation.). This results because of the biasing afforded by the forward-biased diode-connected transistors 113, 114, 115 and 116 to the base electrodes of transistors 111 and 112. $I_0$ can be simply calculated according to Ohm's Law, as follows:

$$I_0 = V_{BE}/R_{117} + R_{EXT} \quad (13)$$

where $R_{117}$ is the resistance of resistor 117 and $R_{EXT}$ is the resistance of any resistive element connected between terminal 118 and ground. (No such external resistive element is shown in FIG. 3.) The biasing applied to the base electrodes of transistors 111 and 112 is such that the current $I_0$ flows substantially in the proportions $I_0 h_{feNPN}/(h_{feNPN} + 1)$ and $I_0/(h_{feNPN} + 1)$, respectively, through the collector-to-emitter paths of transistors 111 and 112, respectively, as explained in U.S. Pat. application Ser. No. 403,990.

The collector current of transistor 111 is applied to the serial connection of diode-connected transistor 119 and resistor 120 to develop a potential which is applied to the base electrodes of transistors 121 and 122. Transistors 121 and 122 are similar in operating characteristics to transistor 119, and their respective emitter degeneration resistors 123 and 124 have the same resistance as resistor 120. The collector currents of transistors 119, 121 and 122 are substantially similar because of the similarity of their base-emitter circuits and their bias conditions. The collector current of transistor 119 is substantially equal to the $I_0 h_{feNPN}/(h_{feNPN} + 1)$ collector current demanded by transistor 111, so the collector currents of transistors 121 and 122 are substantially equal to $I_0 h_{feNPN}/(h_{feNPN} + 1)$. The collector current of transistor 121 is used to apply forward-bias current to the base-emitter junctions of transistors 111–116. A self-biased field-effect transistor 126 is used to initiate conduction in diode-connected transistor 119 and resistor 120. This provides the initial forward-base bias to transistor 121 required for its collector current to begin to flow and provide forward biasing to diode-connected transistors 111–116. The collector current of transistor 122 corresponds to $I_{20}$, the quiescent bias current proportioned between the base electrodes of transistors 11 and 12 in amounts depending upon the conductance of the collector-to-emitter path of transistor 23'.

The collector current of transistor 112 is applied to diode-connected transistor 125 to develop a potential which is applied to the base electrode of a dual collector transistor 127. Transistor 127 responds with the collector currents from each of its collector electrodes which are proportional to the collector current of transistor 125, which is substantially equal to the $I_0/(h_{fe} + l)$ collector current demanded by transistor 112.

A first collector current is supplied by dual-collector transistor 127 via connection 128 to a differential amplifier 130. This current supplies the combined emitter currents of emitter-coupled dual-collector transistors 131 and 132. Input signal terminals 133 and 134 of the differential amplifier 130 are coupled to the base electrodes of its transistors 131 and 132, respectively, via its common-collector amplifier transistors 135 and 136, respectively. One of the collector electrodes of each of the transistors 131 and 132 is connected to its own base electrode. This completes a degenerative feedback loop which lowers the input impedance of the transistor (131 or 132) and reduces the effect the collector-to-base capacitance of the transistor would otherwise have in reducing the bandwidth of differential amplifier stage. The other collector electrodes of transistor 131 and 132 are connected to the input and output circuits, respectively, of a current mirror amplifier 140, which forms an active load circuit with differential amplifier 130 to additively combine the collector current signal variations of transistors 131 and 132.

The current mirror amplifier 140 inverts the collector current variations of transistor 131, which are applied to it, to provide current variations to be additively combined with the collector current variations of transistor 132 at the base electrode of common-collector amplifier transistor 141. The current mirror amplifier 140 is of a type described in a U.S. Pat. application Ser. No. 414,164, filed Nov. 8, 1973, in the name of Carl Franklin Wheatley, Jr., entitled "Circuit With Adjustable Gain Current Mirror Amplifier", and assigned, like the present application, to RCA Corporation. A potentiometer 143 connected between terminals 144 and 145 can be adjusted to vary the quiescent current level provided by differential amplifier 130 to the base electrode of transistor 141.

For equal bias potentials applied to terminals 133 and 134 and no signal potential between those terminals, potentiometer 143 is adjusted so sufficient base current is applied to transistor 141 to cause the following quiescent operating condition. The emitter current of transistor 141, which is an amplified version of its base current, is applied as base current to a following common-collector transistor 146, which demands an emitter current which is a twice-amplified version of the base current supplied to transistor 141. The emitter current demand of transistor 146 from node 148 is adjusted to be somewhat smaller than the $I_0/h_{feNPN} + 1)$ collector current of transistor 127 supplied to node 148 via connection 147. The rest of the current supplied to node 148 is applied as base current to transistor 23' to place its collector-to-emitter path into a desired degree of conduction. That is, transistor 23' diverts a portion of the current $I_{20}$ from flowing to nonlinear resistive network 30' and transistor 11 and directs this portion of the current $I_{20}$ to non-linear resistive network 40' and transistor 12 instead. The proportioning of the collector current $I_{20}$ of transistor 122 between the combination 30', 11 and the combination 40', 12 is such that the quiescent current flow through terminal 13 is nulled. That is, the quiescent current flow in non-linear resistive network 30' plus the quiescent emitter current of transistor 11 is adjusted in response to the setting of potentiometer 143 to equal the quiescent collector current of transistor 12.

When the potential applied to input terminal 134 of differential amplifier 130, is more positive than that applied to its input terminal 133, the conduction of transistor 131 will be increased relative to that of transistor 132. The increased collector current of transistor 131 as inverted by the current mirror amplifier 140 will exceed the collector current of transistor 132 to an increased degree. Consequently, increased base current will be withdrawn from transistor 141. This will increase the emitter current of transistor 141 proportionately and withdraw increased base current from transistor 146. The increased base current withdrawn from transistor 146 will increase its emitter current demand proportionately, thereby diverting a larger fraction of the collector current of transistor 127 away from the base electrode of transistor 23'. In other words, a greater portion of the current flowing to node 148 is applied as emitter current to transistor 146 and a smaller portion is applied as base current to transistor 23'. The collector-to-emitter path of transistor 23' will thus be rendered less conductive. This increases the proportion of current $I_{20}$ which flows as base current to transistor 11 as compared to the portion of $I_{20}$ which flows as base current to transistor 12. This increases the collector-to-emitter conductance of transistor 11 compared to that of transistor 12 and applies a positive current to load 18.

When the potential applied to input terminal 134 is less positive than that applied to input terminal 133, the conduction of transistor 131 will be decreased relative to that of transistor 132. The decreased collector current of transistor 131 as inverted by the current mirror amplifier 140 will still exceed the collector current of transistor 132, but to a decreased degree. Consequently, the base current withdrawn from transistor 141 will be decreased from the quiescent bias condition. The emitter current of transistor 141 which withdraws base current from transistor 146 will be decreased proportionately. The decreased base current withdrawn from transistor 146 will reduce its emitter current demand proportionately. A decreased fraction of the collector current of transistor 127 coupled to node 148, via connection 147, will flow to the emitter electrode of transistor 146. Therefore, a larger proportion of this transistor 127 collector current will be applied as base current to transistor 23'. The collector-to-emitter path of transistor 23 is accordingly made more conductive than for quiescent bias conditions. This increases the proportion of current $I_{20}$, which flows as base current to transistor 12 as compared to the portion of $I_{20}$ which flows as base current to transistor 11. The collector-to-emitter conductance of transistor 12 is increased relative to that of transistor 11, which withdraws current from load 18. (This withdrawal of current from load 18 may be viewed as the application of a negative current to load 18.)

A diode-connected transistor 151 is included in the coupling of the collector electrode of transistor 122 to the non-linear resistive network 30' and base electrode of transistor 11. This diode-connected transistor 151 permits transistor 12 to go into saturated conduction on extreme negative swings of the output signal potential appearing at terminal 13.

The intermediate amplifier circuitry comprising common-collector amplifier transistors 141, 146 and variable conduction device 23' includes a phase-compensation capacitor 152 coupling its output and input circuits. This greatly attenuates the gain of amplifier 100 for frequencies sufficiently high that the accumulated phase shift between its input terminal 133 and its output terminal 13 together with a phase reversal associated with signal inversion approaches a value of $2\pi$ radians. By introducing a dominant single-zero low-pass, time constant into the operational amplifier transfer characteristic to reduce the amplitude of the overall gain of the amplifier below unity for those frequencies, the stability of the complete operational amplifier against self-oscillation will be unconditional even when there is a direct feedback connection between terminals 13 and 133. (This connection could replace the resistive potential divider comprising resistors 153, 155 shown in FIG. 3.) Achieving this increased "phase-margin" by introducing a dominant single time constant attenuation (or "roll-off") of high frequencies does restrict the bandwidth at which full gain is provided by the operational amplifier, however. The less this bandwidth is restricted the better, since then the operational amplifier can be used in a wider variety of system designs.

In the integrated-circuit operational amplifier shown in FIG. 3, a novel arrangement for determining quiescent operating currents in the circuitry preceding the variable conduction device 23' permits the capacitance of the phase-compensation capacitor 152 to be reduced to gain the benefit of increased amplifier bandwidth. At the same time, the risk of self-oscillation is kept low. The novelty of the arrangement lies in causing the quiescent operating currents of differential amplifier 130, current mirror amplifier 140 and common-collector amplifiers 141 and 146 to be inversely portional to the $h_{fe}$ of transistor 23' used as variable conduction device. This departs from the conventional practice in which operating currents are substantially fixed or are allowed to vary slightly in no particular manner.

The following discussion is to help the reader to appreciate why this new arrangement permits reduction of the capacitance of an integrated phase-compensation capacitor 152. First, in integrated circuit designs, integrated components are not individually selected to fall within a certain range of tolerances before being combined with other components. The integrated components are manufactured together. The entire integrated circuit then meets or fails to meet specifications, and there is substantially no possibility of reworking integrated circuits which fail to meet specification, in order to salvage them. This makes circuit designs in which variations in the integrated circuit operating characteristics caused by expected component variations tend to be compensatory, apt to give higher product yields than circuit designs in which variations in the circuit operating characteristics caused by expected component variations "stack-up"—that is, fail to compensate for each other.

Integrated circuits often use negative feedback techniques to reduce the range of variation in operating characteristics from unit to unit of manufacture and thus keep a greater proportion of the units within specifications. The amount of negative feedback required to maintain an acceptably high proportion of the manufacture within specifications can be lessened when the expected component variations in the integrated circuit produce compensatory variations in overall operating characteristics which offset each other. Reduced gain in the negative feedback loop improves its phase margin and thereby reduces the tendency of the loop towards oscillation at higher frequencies.

The value of $I_{20}$ required to permit transistors 11 and 12 to provide full range of output signal current has been determined above. To permit the current $I_{20}$ to be diverted entirely from non-linear resistive network 30' and the base electrode of transistor 11 and to be directed instead to non-linear resistive network 40' and the base electrode of transistor 12, $I_{20}$ must flow as the collector-to-emitter current of transistor 23'. To sustain a collector current flow of $I_{20}$ in transistor 23', its maximum base current must be at least $I_{20}/h_{fe23'}$, where $h_{fe23'}$ is its common-emitter forward current gain.

Now, $h_{fe23'}$ will vary between one integrated circuit amplifier 100 and another because of variations in the manufacturing process. In a conventional design, to guarantee that as many circuits as possible would have adequate base current drive applied to transistor 23' to obtain a collector current flow of $I_{20}$, a worst-case design technique would be followed. Sufficient maximum base current drive would be provided to transistor 23' to guarantee an $I_{20}$ collector current despite $h_{fe23'}$ being at exceptionally low value within its expected range of variation. Conventionally, this design requirement is met by applying large quiescent operating current to the preceding amplifier stages such as 130, 140, 141, 146 so excess capability for base current drive to transistor 23' is provided. The problem with this approach is that the higher quiescent operating current applied to differential amplifier 130 increases its transconductance. This increased transconductance of differential amplifier 130, in combination with the current gain of transistor 23' when $h_{fe23'}$ is at an exceptionally high value within its expected range of operation, determines the worst-case condition under which minimum phase margin is observed in an operational amplifier. The capacitance of phase-compensation capacitor 152 has to be large enough to assure adequate phase margin under these high gain conditions to avoid self-oscillation or ringing of amplifier 100.

Now, consider the departure from the conventional approach for designing operational amplifiers shown in the FIG. 3 amplifier. The transconductance of the input amplifier comprising amplifier 130 and current mirror amplifier 140 varies linearly with the level of the direct current applied to the joined emitter electrodes of transistors 131 and 132. This comes about because—as is well known—the transconductance of transistors 131 and 132 each vary proportionally with their respective emitter currents. The collector current of transistor 127 supplied to the joined emitter electrodes of transistor 131 and 132 has been shown to equal $I_0/(h_{feNPN} + 1)$. Therefore, the transconductance of the input amplifier comprising differential amplifier 130 and current mirror amplifier 140 varies inversely with $h_{feNPN} + 1$.

As already pointed out, the common-emitter forward current gain $h_{fe23'}$ of transistor 23 is $h_{feNPN}$. The product of the transconductance of input amplifier multiplied by $h_{fe23'}$ is one of the factors which affects the overall voltage gain of the integrated operational amplifier 100. The increase of the transconductance of the input amplifier with decreased $h_{feNPN}$ offsets the decrease of $h_{fe23'}$ in determining the overall voltage gain of the integrated operational amplifier 100, and on the other hand, the decrease of the transconductance of the input amplifier with increased $h_{feNPN}$ would offset the increase of $h_{fe23'}$.

This means that the range of overall voltage gain of the integrated operational amplifier 100 has been reduced, and the necessity of some of the manufactured units being over-designed with regard to that parameter in order to meet a minimum specification is accordingly reduced. In a production run or series of production runs, the number of units with gains well above average is reduced, and a much lower percentage of units with exceptionally high gains will appear. This means that the capacitance of the phase compensation capacitor 152 can be decreased compared to a worst-case design using traditional techniques of determining operating currents while at the same time maintaining a specified phase margin specification over the same percentage of units.

The smaller phase-compensation capacitance broadens the bandwidth which can be obtained for an operational amplifier when that capacitance must be predetermined for all units of manufacture. The smaller phase-compensation capacitance is more readily integrable with a small area on the integrated circuit die.

Amplifier 100 has been constructed using reverse-biased junction isolation techniques, using a 4 pf phase compensation capacitor 152 and resistance values for its various resistive elements as set forth in the following table.

| Resistive Element | Resistance in Ohms |
|---|---|
| 32 | 180 |
| 42 | 130 |
| 117 | 1100 |
| 120 | 200 |
| 123 | 200 |
| 124 | 200 |
| 149 | 2200 |

When reverse biased junction isolation is employed to construct amplifier 100, transistor 122 may be assumed to have the lateral structure used for integrated PNP transistors. The need for the resistance of resistor 32 to be somewhat larger than that of resistor 42 comes about because the collector current of transistor 122 for such lateral structure is sensitive to its collector potential.

When the collector-to-emitter path of transistor 23' is non-conductive, an increased proportion of the current $I_{20}$ flows to the base electrode of transistor 11. The resulting increased emitter current in transistor 11 causes a positive-going swing in the potential at terminal 13. This swing translated via the parallel combination of the base-emitter junction of transistor 11 and non-linear resistive network 30' and via diode-connected transistor 151 decreases the collector-to-emitter potential of transistor 122 from its quiescent value. The collector current $I_{20}$ of transistor 122 is reduced somewhat from its quiescent value.

When the collector-to-emitter path of transistor 23' is fully conductive, the collector electrode of transistor 122 is clamped to the base-emitter offset potential of transistor 12 (about 650 millivolts) plus the saturation voltage of transistor 23' (about 100 or 200 millivolts). Thus, the collector-to-emitter potential of transistor 122 is substantially larger than quiescent value, and the collector current $I_{20}$ is substantially larger than quiescent value, and the collector current $I_{20}$ of transistor 122 is increased somewhat from its value for the operating condition previously described.

Resistor 32 is made somewhat larger in resistance than resistor 42 to cause a somewhat larger multiplication of the $I_{20}$ current during pronounced conduction of transistor 11 than during pronounced conduction of transistor 12. This compensates for the somewhat lower value of $I_{20}$ during pronounced conduction of transistor 11 than during pronounced conduction of transistor 12.

Resistor 149, which may be a pinch resistor, is included to provide a small direct potential drop required to secure adequate collector potential for the collector electrode of transistor 132 connected to the base electrode of transistor 141 when the base electrodes of transistors 131 and 132 are operated with a quiescent potential equal to that appearing at terminal 15.

Figure 4:
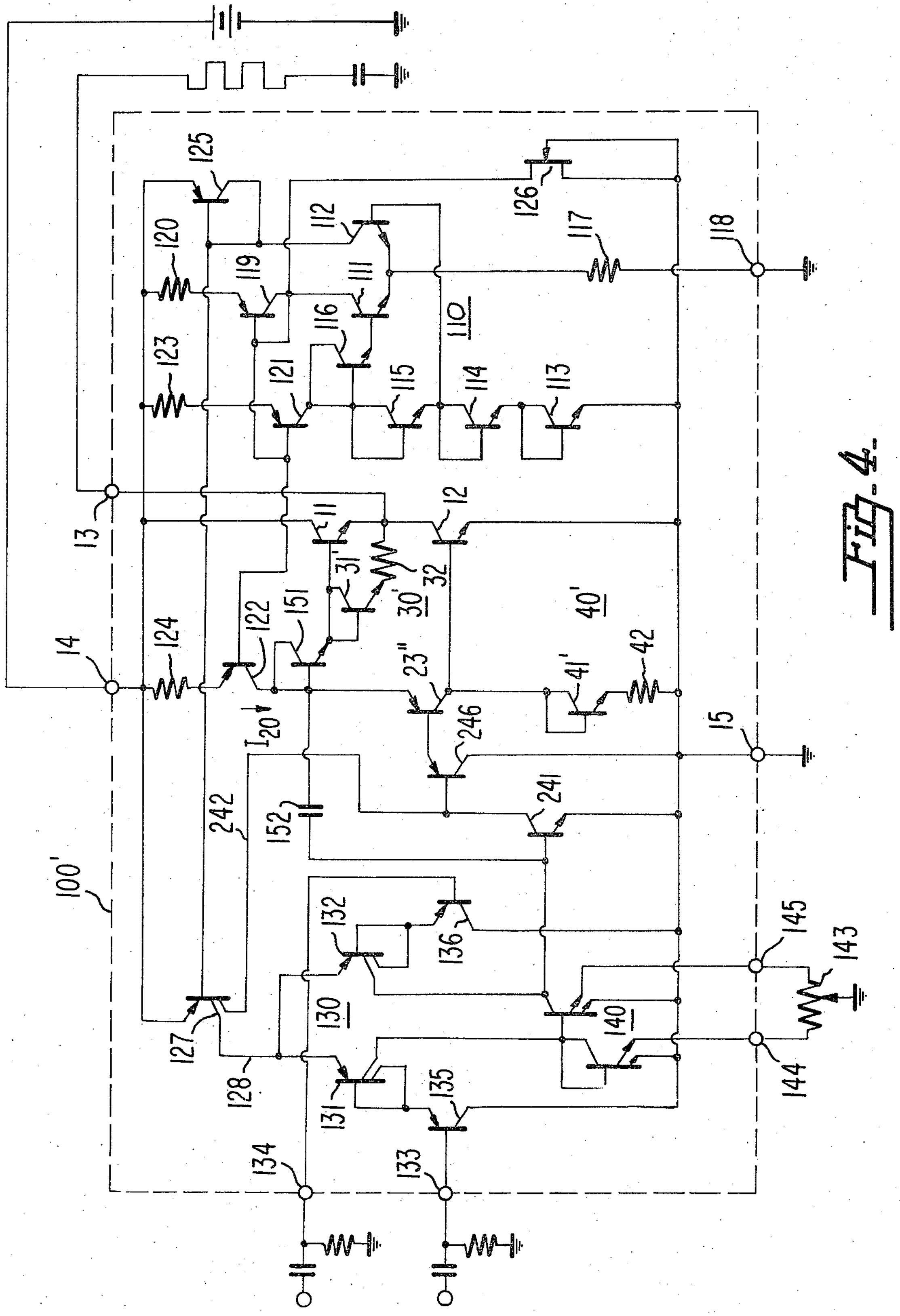
FIG. 4 is a schematic diagram of an alternative configuration to that shown in FIG. 3.

FIG. 4 shows a Class AB operational amplifier 100' which is similar to amplifier 100, but in which the variable conduction device 23 comprises a transistor 23'' of a conductivity type which is the opposite to that of output transistors 11 and 12. Amplifier 100' offers improved operation at higher operating temperatures when input terminals 133 and 134 are biased to the same quiescent potential as appears on terminal 15 (here shown as ground) rather than to a quiescent potential intermediate between those impressed upon terminals 14 and 15.

Differential amplifier 130 supplies signal current to the base electrode of grounded-emitter amplifier transistor 241. Grounded-emitter amplifier transistor 241 is provided an $I_0/(h_{feNPN}+1)$ constant current source collector load via connection 242 from transistor 127. The collector signal current of transistor 241, which is an amplified version of its base current, is applied to the base electrode of a grounded-collector amplifier transistor 246 for further current amplification. A twice-amplified version of the signal current applied to the base electrode of transistor 241 appears at the emitter electrode of transistor 246 and is applied to the base electrode of transistor 23'' to control the conduction of its collector-to-emitter path.

As was done with the FIG. 3 operational amplifier, the potentiometer 143 of the operational amplifier shown in FIG. 4 is adjusted to obtain the following quiescent condition. The quiescent input current supplied to the base electrode of transistor 241, then amplified by transistors 241 and 246 applied to the base electrode of transistor 23'', is adjusted to cause the collector-to-emitter path of transistor 23'' to be partially conductive. More particularly, the partial conduction of this path is such that the relative conductance of transistors 11 and 12 are proportioned so that the quiescent potential appearing at terminal 13 is mid-way between the potentials appearing at terminals 14 and 15. This adjustment of the potentiometer 143 is made with terminals 133 and 134 being at substantially the same potential.

When the potential appearing on terminal 134 is more positive or less negative than that appearing on terminal 133, the base current delivered to transistor 241 will be reduced from its quiescent value. This will, in turn, reduce the base current supplied to transistors 246 and 23'', and will cause a reduction in the conductance of the collector-to-emitter path of transistor 23''. As noted previously, reduction of the conductance of the variable conduction device 23, 23' or 23'' between terminals 21 and 22 cause transistor 11 to become substantially more conductive than transistor 12. This results in positiveward swing in the output potential appearing at terminal 13.

When the potential applied to terminal 134 is less positive or more negative than that applied to terminal 133, the base current supplied to transistor 241 will be increased. This will, in turn, increase the base currents of both transistors 246 and 23'' and result in increased conductance of the collector-to-emitter path of transistor 23''. As noted previously, the increased conductance of the variable conduction device 23, 23' or 23'' between terminals 21 and 22 causes transistor 12 to be more conductive than transistor 11 and results in the output potential appearing at terminal 13 swinging negativeward in value.

In amplifier 100', the gain of differential amplifier 130 varies in inverse proportion with $h_{feNPN}$ and provides offsetting compensation for changes in the gain of the grounded emitter transistor 241, $h_{feNPN}$. This permits phase-compensation capacitor 152 to be made smaller in capacitance and the bandwidth of the integrated operation amplifier 100' to be increased.

What is claimed is:

1. An amplifier comprising:

an interconnection point adapted for coupling to a load circuit;

first and second transistors of the same conductivity type, each having a principal conduction path between first and second electrodes and having a control electrode, the conductance of said conduction path of each of said first and said second transistors respectively increasing and decreasing as the potential appearing between said first and said control electrodes is respectively increased and decreased, said first transistor first electrode and said second transistor second electrode being connected to said interconnection point adapted for coupling to a load circuit;

means for applying an operating potential between said first transistor second electrode and said second transistor first electrode;

a source of substantially constant quiescent biasing current;

a variable conduction device with a control electrode and a variable conduction path between first and second electrodes thereof, the conductance of said conduction path varying in response to a control signal applied to said control electrode, said first electrode of said device being connected to said source of a substantially constant quiescent biasing current and having said first transistor control electrode coupled thereto, said second electrode of said device having said second transistor control electrode coupled thereto.

2. An amplifier as set forth in claim 1 wherein said source of biasing current includes means for constraining the magnitude of said biasing current such that current flow through either of said first and said second transistors even when substantially all of said operating potentials appears across its principal conduction path will not cause sufficient internal heating of the transistor to lead to its being seriously and permanently damaged.

3. An amplifier as set forth in claim 1 wherein said first and said second transistors are bipolar transistors, each having base and emitter and collector electrodes corresponding respectively to said control and said first and said second electrodes, each having a base-emitter junction between its said base and emitter electrodes, said amplifier further including:

first and second semiconductor junction diodes;

first and second linear resistive elements;

means connecting said first semiconductor junction diode and said first linear resistive element in a first serial combination, between said first transistor base and emitter electrodes with said junction poled in the same direction as said first transistor base-emitter junction; and means connecting said second semiconductor junction diode and said second linear resistive element in a second serial combination, connected between said second transistor base and emitter electrodes and with said second junction poled in the same direction as said second transistor base-emitter junction.

4. An amplifier as set forth in claim 3 wherein said first and said second semiconductor junction diodes each consists of:

a further transistor having an emitter electrode and interconnected base and collector electrodes.

5. An amplifier as set forth in claim 3 wherein:

a third transistor corresponds to said variable conduction device, said third transistor having collector and emitter electrodes corresponding respectively to its said first and said second electrodes, having a base electrode and having a common emitter forward current gain $h_{fe}$;

a source of input signal; and means for coupling said input signal to said third transistor base electrode.

6. An amplifier as set forth in claim 5 having:

means for providing selective collector-to-base feedback to said third transistor including a phase-compensation capacitor for introducing a dominant single-pole high-frequency roll-off into the overall gain characteristic of the complete amplifier and an input amplifier with transconductance which varies substantially inversely with the $h_{fe}$ of said third transistor said input amplifier being included within said means for coupling said input signal to said third transistor base electrode thereby causing the phase margin for the complete amplifier to be less dependent upon the value of the $h_{fe}$ of said third transistor.

7. An amplifier as set forth in claim 3 having:

a third transistor having base and emitter and collector electrodes and having a common emitter forward current gain $h_{fe}$;

means connecting said third transistor in an intermediate amplifier with an input circuit and an output circuit and with a forward current gain therebetween substantially proportional to the $h_{fe}$ of said third transistor, said intermediate amplifier output circuit being connected to the control electrode of said variable conduction device to supply it said control signal;

means for providing collector-to-base selective feedback to said third transistor including a phase-compensation capacitor for introducing a dominant single time constant high-frequency roll-off into the overall gain characteristics of the complete amplifier;

a source of input signal; and an input amplifier with transconductance which varies substantially inversely with the $h_{fe}$ of said third transistor, said input amplifier having an input circuit connected to said source of input signal and an output circuit connected to the input circuit of said intermediate amplifier, thereby causing the phase margin for the complete amplifier to be less dependent upon the value of the $h_{fe}$ of said third transistor.

8. An amplifier as set forth in claim 3 wherein said source of substantially constant quiescent biasing current comprises:

a third transistor of a conductivity type complementary to said first and said second transistors, having an output electrode connected to said first electrode of said variable conduction device and having an input electrode and a common electrode; and means for applying forward bias potential between the input and common electrodes of said third transistor for causing said third transistor to provide said substantially constant quiescent biasing current from its said output electrode.

9. An amplifier as set forth in claim 8 wherein:

said third transistor has a transconductance which varies as a function of the potential between its common and output electrodess and wherein said first linear resistive element has larger resistance than said second linear resistive element to compensate for this variation of the transconductance of said third transistor, such that a more symmetrical gain characteristic is obtained for the push-pull operation of said first and said second transistor.

10. An amplifier as set forth in claim 3 wherein said source of substantially constant quiescent biasing current includes:

means for constraining the magnitude of said biasing current such that current flow through either of said first and said second transistors even when substantially all of said operating potential appears across its principal conduction path will not cause sufficient internal heating of the transistor to lead to its being seriously and permanently damaged.

11. An amplifier as set forth in claim 1 wherein:

said first and said second transistors are bipolar transistors, each having base and emitter and collector electrodes corresponding respectively to said control and said first and said second electrodes, and each having a base-emitter junction;

a third bipolar transistor of the same conductivity type as that of said first and said second transistors corresponds to said variable conduction device, and its collector and emitter and base electrodes correspond respectively to the first and second and control electrodes of said variable conduction device; and a unilaterally conductive semiconductor junction device is connected between the collector electrode of said third transistor and the base electrode of said first transistor, said junction device being poled for simultaneous easy conduction with the base-emitter junction of said first transistor.

12. An amplifier as set forth in claim 1 wherein:

said first and said second transistors are bipolar transistors, each having base and emitter and collector electrodes corresponding respectively to said control and said first and said second electrodes, and each having a base-emitter junction;

a third bipolar transistor of a conductivity type opposite from that of said first and said second transistors corresponding to said variable conduction device, and its emitter and collector and base electrodes corresponding respectively to the first and second and control electrodes of said variable conduction device;

a unilaterally variable semiconductor conduction device is connected between the emitter electrode of said third transistor and the base electrode of said first transistor, said junction device being poled for simultaneous easy conduction with the base-emitter junction of said first transistor.

13. An amplifier comprising:

first and second bipolar transistors, each having emitter and collector electrodes with a collector-to-emitter path therebetween and each having a base electrode and a base-emitter junction between its said emitter and said base electrode;

first and second semiconductor junction diodes;

first and second linear resistive elements;

a serial combination of said first semiconductor junction diode and said first linear resistive element connected in a first parallel combination with said first transistor base-emitter junction, with said first semiconductor junction being poled for concurrent forward conduction with said first transistor base-emitter junction;

a serial combination of said second semiconductor junction diode and said second linear resistive element connected in a second parallel combination with said second transistor base-emitter junction, with said second semiconductor junction being poled for concurrent forward conduction with said second transistor base-emitter junction;

means responsive to input signal thereto applied to supply first and second signal currents which are in push-pull relationship to each other and to said first and said second parallel combinations, respectively; and means for connecting the collector-to-emitter paths of said first and said second transistors in series for application of operating potential and in push-pull for supplying an output signal responsive to said first and second signal currents.

14. An amplifier as claimed in claim 13 wherein:

said first and said second bipolar transistors are of the same conductivity type; and the emitter electrode of said first transistor is connected to the collector electrode of said second transistor.

15. An amplifier as claimed in claim 14 wherein said means responsive to input signal thereto applied to supply first and second currents, respectively, to said first and said second parallel combinations comprises:

a supply of substantially constant current;

means for connecting said supply of substantially constant current to the end of said first parallel combination at the base electrode of said first transistor; and a variable conduction device with a control electrode and a variable conduction path between first and second electrodes thereof, the conductance of said conduction path varying in response to said input signal applied to its said control electrode, said first and said second electrodes thereof being connected respectively to said supply of substantially constant current and to the end of said second parallel combination at said second transistor base electrode.

16. An amplifier as claimed in claim 15 wherein the amplitude of the substantially constant current supplied from said source thereof is constrained thereby to provide over-current protection for said first and said second transistors.

17. An amplifier as claimed in claim 15 wherein said variable conduction device is a transistor of the same conductivity type as said first and said second transistors; its base, collector and emitter electrodes corresponding to the aforeclaimed control, first and second electrodes of said variable conduction device.

18. An amplifier as claimed in claim 17 wherein said means for connecting said supply of substantially constant current to the end of said first parallel combination is a semiconductor junction device poled for simultaneous easy current conduction with said first parallel combination.

19. An amplifier as claimed in claim 15 wherein said variable conduction device is a transistor of opposite conductivity type from that of said first and said second transistors; its base, emitter and collector electrodes corresponding to the aforeclaimed control, first and second electrodes of said variable conduction device.

20. An amplifier as claimed in claim 19 wherein said means for connecting said supply of substantially constant current to the end of said first parallel combination is a semiconductor junction device poled for simultaneous easy current conduction with said first parallel combination.

21. An amplifier comprising, in combination:

a pair of terminals between which an operating voltage may be applied;

two semiconductor devices, each having a conduction path and a control electrode for controlling the conductance of said path, said conduction paths connected in series between said terminals;

a current source providing a constant current at a level lower than that which will damage either device;

and means including a signal responsive variable conductance means receptive of the current provided by said source, for supplying one portion of said current to one control electrode and the other to the other control electrode, in accordance with the value of a parameter of said signal.

22. An amplifier as set forth in claim 21 wherein said means including said signal responsive variable conductance means comprises a connection from said current source to one of said control electrodes, and said variable conductance means being connected between said control electrodes for diverting a portion of said constant current to the other control electrode.

23. An amplifier as set forth in claim 22 wherein said semiconductor devices comprise first and second bipolar transistors, each having base and emitter electrodes with a base-emitter junction therebetween and each having a collector electrode, said conduction paths comprising the emitter-to-collector paths of said transistors.

24. An amplifier as set forth in claim 23 further including first and second non-linear resistive means, said first non-linear resistive means being connected between the base and emitter electrodes of said first transistor to parallel its base-emitter junction and said second non-linear resistance means being connected between the base and emitter electrodes of the second transistor to parallel its base-emitter junction, said first and said second non-linear resistance means each being conductive under quiescent conditions to divert base current from the base-emitter junction with which it is parallelled, the respective conductances of said first and said second non-linear resistance means increasing less rapidly with increasing potentials respectively thereacross than do the conductances of the base-emitter junctions of said first and said second transistors, respectively, for conditioning said first and said second transistors for Class AB amplification.

* * * * *